(12) United States Patent
Glew

(10) Patent No.: US 7,884,299 B2
(45) Date of Patent: Feb. 8, 2011

(54) SWITCH WITH CAPACITIVE SENSING ELEMENT

(76) Inventor: Daniel John Glew, 88 Ngataringa Road, Devonport, Auckland (NZ)

(*) Notice: Subject to any disclaimer, the term of this patent is extended or adjusted under 35 U.S.C. 154(b) by 675 days.

(21) Appl. No.: 11/855,318

(22) Filed: Sep. 14, 2007

(65) Prior Publication Data

US 2008/0067052 A1 Mar. 20, 2008

(30) Foreign Application Priority Data

Sep. 14, 2006 (NZ) .................................. 549865

(51) Int. Cl.
*H03K 17/975* (2006.01)
(52) U.S. Cl. ...................................... 200/600; 200/310
(58) Field of Classification Search .................. 200/600, 200/302.1, 302.2, 303, 308–317, 512–520; 362/253, 276

See application file for complete search history.

(56) References Cited

U.S. PATENT DOCUMENTS

| 3,297,853 A | * | 1/1967 | Schmiedel et al. | .......... 200/300 |
| 2005/0133351 A1 | * | 6/2005 | Hein | .......................... 200/310 |

* cited by examiner

*Primary Examiner*—Renee Luebke
*Assistant Examiner*—Marina Fishman
(74) *Attorney, Agent, or Firm*—Young & Thompson

(57) ABSTRACT

A switch adapted to make and/or break a connection in an electric circuit to operate a device has a front to face the user and a rear to face away from the user, a housing, and switch mechanism. The switch mechanism includes in operative connection, a lens facing the front, an information element, a control element, a lighting element, a capacitive sensing element and a power element to operate the lighting element and sensing element. The switch includes a communication element to provide electrical connection to the device and is activated by the control element when a change in capacitance is sensed by the capacitive sensing element such that the information element and lighting element can be viewed through the lens and the device is operated.

3 Claims, 4 Drawing Sheets

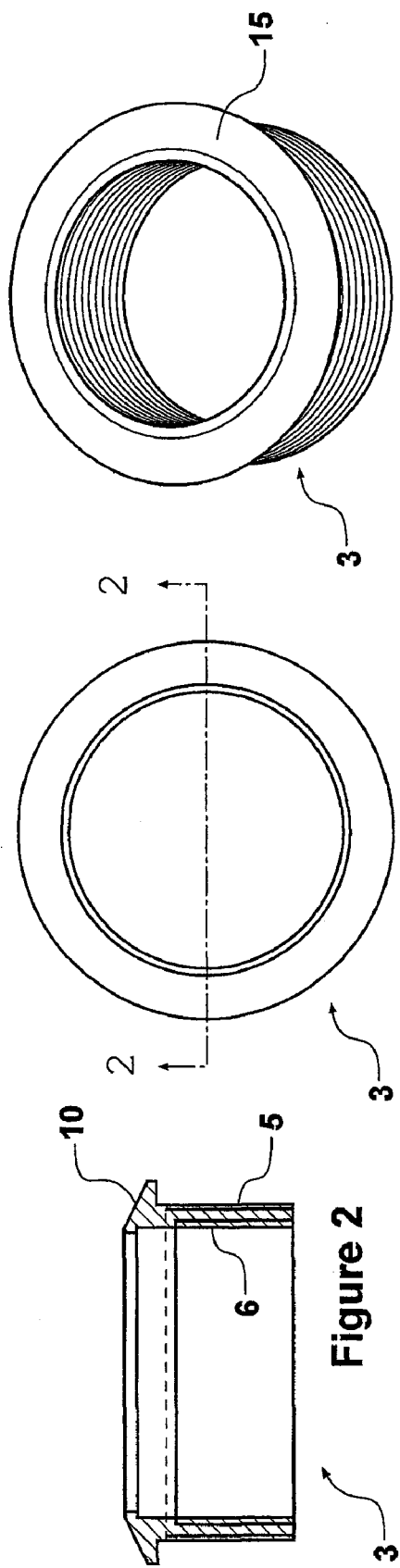

SWITCH WITH CAPACITIVE SENSING ELEMENT

The invention relates to a switch. The invention is directed particularly but not solely towards a touch free switch for public use that includes indicator lighting.

BACKGROUND OF INVENTION

Public facilities must be tough to survive public use, the weather and cleaning. There are constant problems with switching devices which can be used in toilets, to activate automatic doors and carryout various switch requirements such as activating dispensers flushing, movement of toilet seats in a seat wash unit, sensor operated hand washing and drying in these facilities such as with toilets. Other public facilities include lifts, shower units, security devices, trains, buses, public buildings, lighting or any switching function in general.

Some switches being used are contact switches or contacts push buttons which include push button mechanisms incorporating a spring loaded button that when depressed will move a metal strip or conductor to contact between two electrical points providing a bridge that allows an electrical current to flow through from one point to the other. These switches are reliant on the contacts being clean to allow the current flow through but the contacts often corrode which can inhibit any low voltage electrical signal. Typically switches need to be self cleaning but with the low voltages being used, these switches can not self clean. Contact switches comprise plastic button heads which provide insulation to prevent any electrical shock but there have been problems with vandals who burn any switch cover to disable them. To meet disabled access codes any switch need to be a certain size which means that these switch tend to be industrial types having a housing construction that allows for easy unwanted removal by vandals.

Other switches being used are piezo pulse push switches but these required touching like the contact switches to operate. In a toilet situation, any touching can be a health concern for users whereby bacteria can be transferred. These switches consist of a bimetal disc that activates with a slight depression of a front disc surface when pushed causing contact with the surface behind providing a momentary pulse of electrical contact. They work well with electronic equipment that only requires a pulse of current to switch the relevant relay. These switches come in limited sizes of diameters up to 32 mm with a small LED or ring of light around the edge of the push button with a 16 mm switch. Piezo pulse switches have few moving parts and are more vandal resistant than contact switches but they still can easily be damaged by vandals by impact to cause them to either not work at all or work intermittently.

Other switches used, are microwave sensor switches which work by emitting and receiving microwaves on a continuous basis and detecting any change in the type of reflection received back. These come in a large box as they need to accommodate a cast dopler unit or electronic sensor plate. These types of switches are not suitable with metallic panels nor do their wide sensing range means they are not particularly suited to point switching.

Any light activated sensors or infrared sensors work by emitting and receiving back an infrared beam from the lens. These switches can come with a fixed range or an adjustable range that determines how far away from the face of the sensor it will sense an object. Within this range the beam is broken or obstructed to activate the switch. This switch is made from plastics and can include such features of a normal closed operation, normal open operation, PNP (switching with a positive output or NPN (switching with a negative output). Though users are very familiar with these types of switches and they can include many sizes with an activation light they suffer from several drawbacks. They are not very useful in this situation as vandals can easily deactivate these by covering with graffiti which may cause some users to be trapped within the toilet facility or they can burn the plastics of the switch. Their construction utilizes a double nut system like other switches which particular easy to dismantle from the front.

Appearance has to be considered in any switch as users may not see them to use them and various regulatory bodies have rules to allow adequate access and vision of any switch. As the switches are often required to be located externally of any facility they also need to be attractive in appearance.

In general capacitive sensor switches have a very short range and work by continually scanning the immediate environment. It activates when it senses a change in capacitance or density near the sensor head. Most capacitance switches recalibrate regularly to allow for any slow change in environment but will switch when a sudden change in capacitance is sensed. They are normally used in commercial applications such as manufacturing and comprise a large plastic case which is long in comparison to the sensor head. They have many disadvantages such as causing an adjacent metal surface to become an amplifying aerial so that touching the adjacent metal surface becomes the trigger for the switch. If water goes on the lens surface it will trigger the switch. The construction of these switches having long threaded barrels with two removable nuts, do not allow flush mounting thereby causing them to protrude and be less vandal resistant.

Commercially and practically there are long standing problems and needs in the industry to solve the problems of all the switches as discussed. There is nothing suitable to solve these problems, which necessitated the development of this invention.

In this specification unless the contrary is expressly stated, where a document, act or item of knowledge is referred to or discussed, this reference or discussion is not an admission that the document, act or item of knowledge or any combination thereof was at the priority date, publicly available, known to the public, part of common general knowledge; or known to be relevant to an attempt to solve any problem with which this specification is concerned.

OBJECT OF THE INVENTION

It is an object of the invention to provide an improved switch that ameliorates some of the disadvantages and limitations of the known art or at least provide the public with a useful choice.

SUMMARY OF INVENTION

In a first aspect the invention comprises a switch adapted to make and/or break a connection in an electric circuit to operate a device, the switch including a front to face the user and a rear to face away from the user, a housing, and switch mechanism, the switch mechanism includes in operative connection, a lens facing the front, information means, control means, lighting means, capacitive sensing means and power means to operate the lighting means and sensing means, whereby the switch includes communication means to provide electrical connection to the device wherein the switch is activated by the control means when a change in capacitance is sensed by the capacitive sensing means such that the information means and lighting means can be viewed through the lens and the device is operated.

Preferably the switch is fluid-proof whereby fluid originating from weather and/or from cleaning does not affect the working of the switch wherein the switch includes a sealing means therein comprising an O-ring located around the lens, and sealingly engaging with the housing.

Preferably the sensing means of the switch is capacitance sensing.

Preferably the switch is substantially vandal proof whereby front surface is substantially flush mounted to a support surface.

Preferably, a cover threadingly engages with the rear of the housing to cover the sensing means, information means and control means.

Preferably, the information means is in the form of a disc located under the lens and the control means is located under the disc whereby the disc functions to cover the control means.

Preferably the disc also functions to increase the activation field or sensitivity range from the capacitor sensing means and provide information.

Preferably, the sensing means is located under the disc.

Preferably, the control means includes a PC Board.

Preferably, the lighting means includes LED's (light emitting diodes) which are located on the PC board.

Preferably, the lens is an impact resistant see-through high impact acrylic material.

Preferably, the disc has at least one word and/or symbol thereon to face the user through the lens.

BRIEF DESCRIPTION

The invention will now be described, by way of example only, by reference to the accompanying drawings:

FIG. 1 is a general cross section of the switch.
FIG. 2 is a general cross section of the switch housing.
FIG. 3 is a top plan view of the housing of FIG. 2.
FIG. 4 is a perspective view of the housing.
FIG. 5 is a general cross section of the switch lens.
FIG. 6 is a top plan view of the lens.
FIG. 7 is a perspective view of the lens.
FIG. 8 is a schematic of a circuit diagram.

DESCRIPTION OF DRAWINGS

The following description will describe the invention in relation to preferred embodiments of the invention, namely a switch. The invention is in no way limited to these preferred embodiments as they are purely to exemplify the invention only and that possible variations and modifications would be readily apparent without departing from the scope of the invention.

As shown in FIGS. 1-8 there is a switch 1 in one type of use being located or affixed to a wall or back plate 2 of any public facility. The switch 1 in use has a front face F facing a user and back face B not facing a user. Switch 1 can be used in any type of facility such as toilets, restrooms lifts or public transport etc and or anywhere a switch is needed to operate a device or initiate an action such as 'seat down', 'flush' or 'close door. Switch 1 includes a housing 3 and a lens 4, followed by information means 5, control means 6, sensing means 7 and power means 8.

Figure 1:
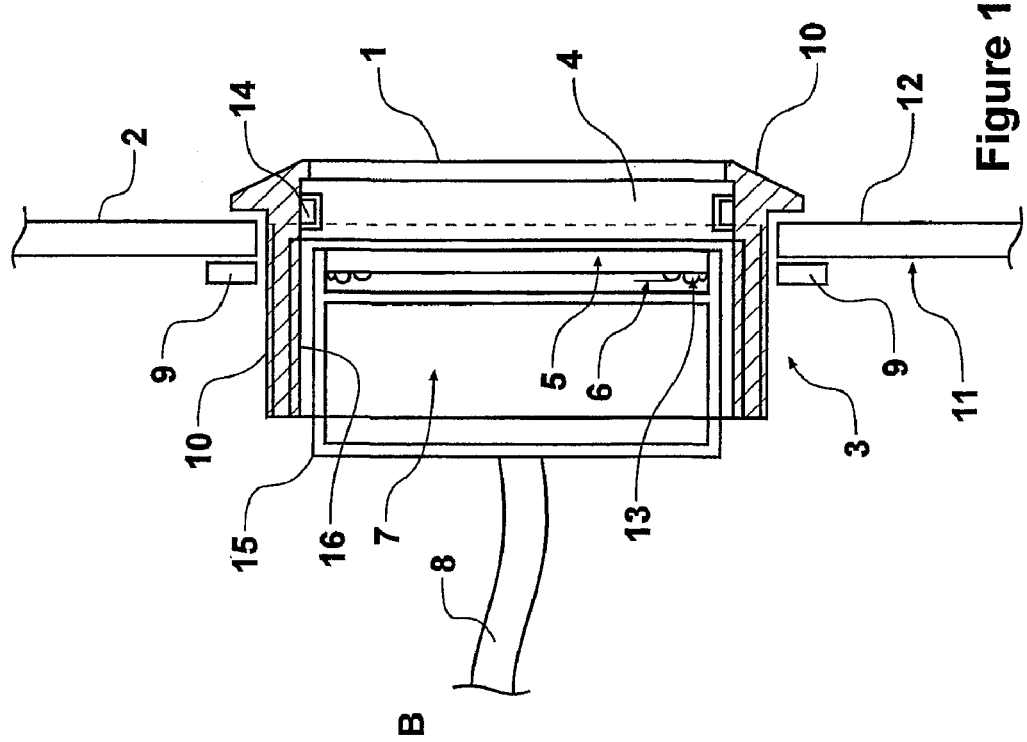
Figure 7:
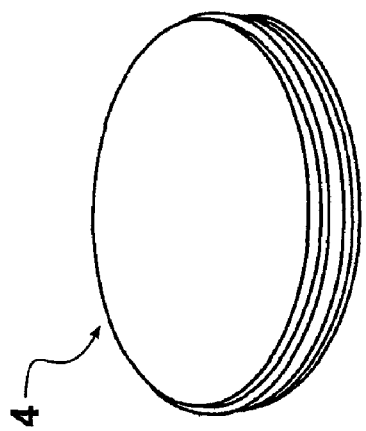
Figure 6:
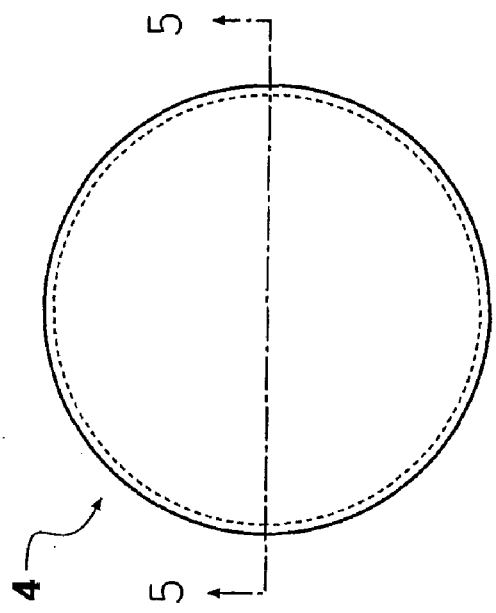

The housing 3 can be affixed to the wall 2 by fixing means 9 in such a manner as to make unlawful removal from the wall, extremely difficult. Housing 3 has an outer thread 10 whereby a back nut as shown can be rotated on to affix the housing 3 to a back surface 11 of the wall 2.

Housing 3 also has a bezel portion 10 on the front face of the switch whereby the housing 3 sits substantially flush with front face surface 12. This helps in reducing any accidents due to collisions with protruding edge portions. Also this makes it much harder for vandals to remove and or damage the switch and assists in weather tightness for both external and internal use and for cleaning with fluids, steam or gas. Bezel portion 10 also assists in cleaning whereby the switch can be properly cleaned leaving minimal hidden dirty surfaces.

Housing 3 can be made out of any suitable material or blend of materials for the intended use such as brass, bronze or aluminium.

Figure 5:
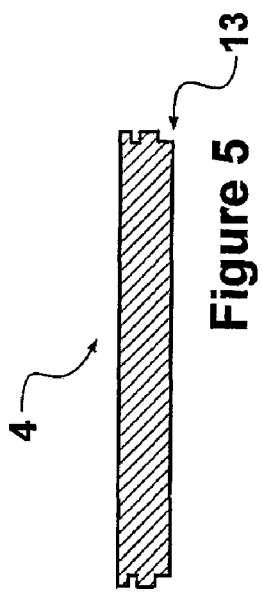

Lens 4 can be any suitable thickness and material type or combination that allows view there-through and is impact resistant such as for example 4.5 mm thick acrylic material. As shown in FIG. 5 for weather tightness lens 4 can have a sealing means which comprises a grooved or rebated peripheral portion for a sealing ring 14 (for example an O-ring) which can interfit with a complementary portion 15 inside housing 2 as shown in FIG. 4. The lens 4 can also have a rebate on the front face so that it sits flush with the chrome bezel portion 10. The acrylic material can be high impact which is resistant to shattering by impact and is chemically resistant to most chemical cleaning agents as used in general cleaning or industrial cleaning for health requirements and removal of graffiti.

In use under the lens, information means 5 which can be for example in a decorative disc shape or any shape to fit within the housing 2, control means 6 can be for example a PC board or printed circuit board and sensing means 7, can be termed the switch mechanism. Sensing means 7 can be a capacitive sensor which is covered by the control means (PC board) 6 which in turn is covered by disc 5 which is then followed by lens 4. As well providing an outer surface facing a user for information the disc 5 is used to cover or mask the controls of the PC board and/or to increase sensitivity or the range of the sensing means 7.

PC board 6 includes circuitry and lighting means 13 such as LEDs and are operatively connected to power means 8 such that in operation that when the sensor 7, senses a change in capacitance the LED's 13 which can be always on or activate only when a change in capacitance occurs, sends a signal to whatever the switch is electrically connected to via a communication means, to do what it has to do as instructed or as shown by the information means to for example "flush" or "drop seat" or "unlock" the door or "lock" the door. The LEDs 13 can be provided or located on the PC board 6 or anywhere electrically connected and in an array thereof or in any configuration as desired and can be of high intensity but low heat. PC board 6 can be configured to include options of either a normally closed circuit or normally open circuit operation and have the lights normally on and going off when triggered and/or vice versa.

Power means 8 is adapted to provide power to the lighting means 13 and to the sensing means 7.

The disc 5 can comprise a material(s) that functionally and operatively fits with the other parts of the switch and is sized smaller than the PC board 6, to allow the LED's 13 located around the outside circumference to be seen when in place in the housing from the front or through the lens 4. Disc 5 can function to increase the activation field which comes from the capacitive sensing means and can have any wording and/or symbols printed on or attached to. For example "flush" or "seat down". Disc 5 can be any metal such as aluminium which acts like an aerial to increase the sensing range from about 5 mm off the surface to 15 mm off the surface.

Figure 8:
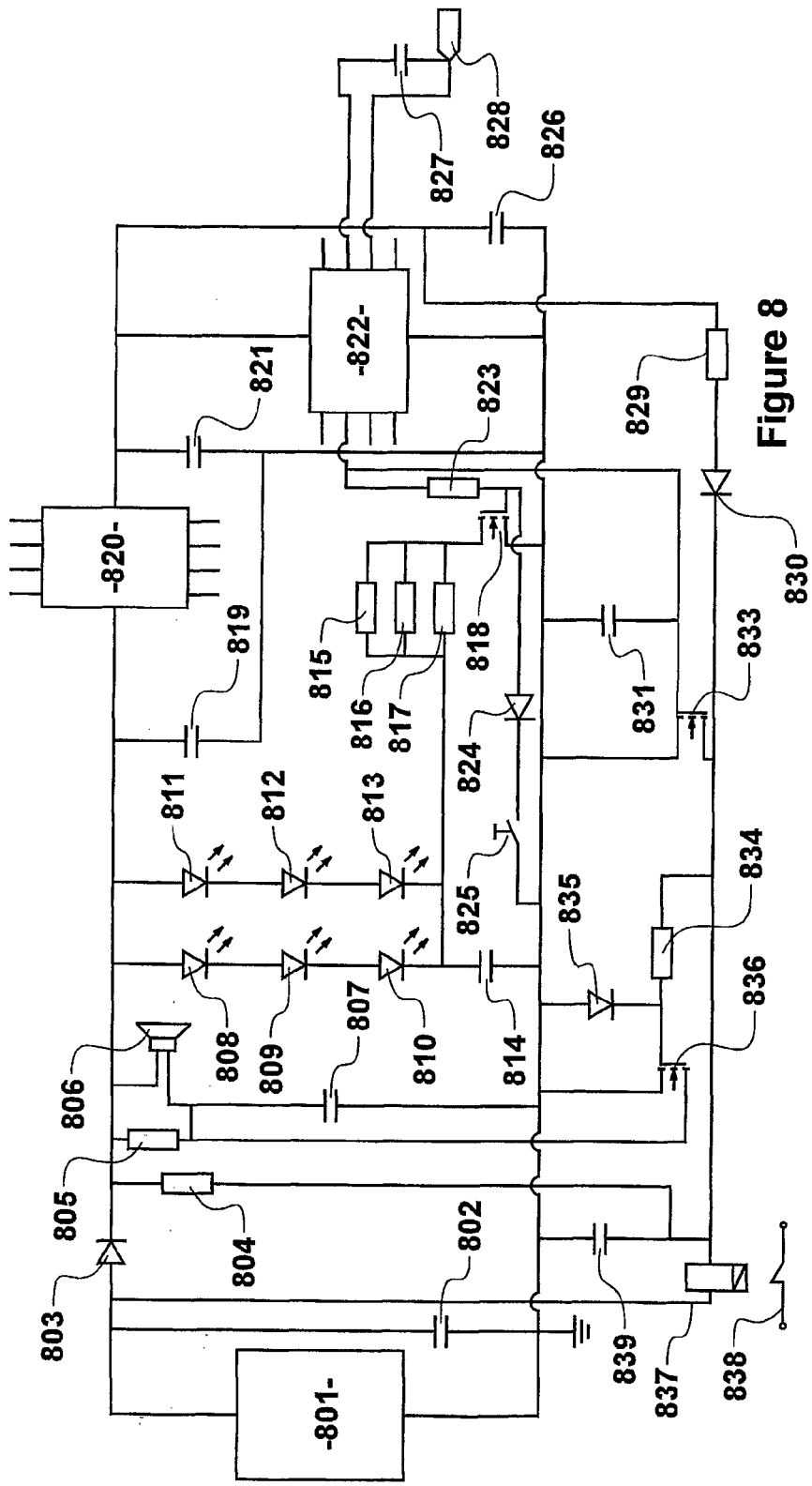

As shown in FIG. 1 sensing means 7 is fitted into the rear of PC board 6 so that they can be fitted into the rear of housing 3 and then covered by a cover 15 having an external thread that interfits with the housing thread 16 as shown in FIG. 1. Cover 15 also can have at least one aperture to allow power means 8 to be connected therethrough and therewith. The switch includes communication means as shown in FIG. 8 to allow electrical communication of the switch with any device that needs operating. The sensing means includes a capacitive sensing means as commonly available which allows a touch free or proximity sensing to be sensed to operate the device.

During fitting and assembling of the switch the following steps can include first push lens in place into the housing;

next in order, push the PC board and disc behind the lens in the housing next push in sensing means;

lastly secure everything by the cover 15 which can be in the form of a male threaded plastic back cap into the back of the housing;

form aperture/hole in wall support;

fit housing in from front into the hole so that it protrudes from back;

fit back nut to rear of housing to affix to support and;

electrically connect power source and connect switch to any device

The steps can be varied from example by fitting the PC board and LEDs to the sensing means before fitting to the housing or the switch can be reassembled and simply fitted to tire support in one piece.

The lens or switch can be sized or dimension to meet any local regulations or government requirement in terms or health and safety and also allows for the very young and old or impaired. For example the diameter can be for example 65 mm to meet disabled requirements. It is touch free or proximity sensing minimizing any bacterial transfer. The lights LED can be illuminated with a ring of lights going out momentarily when the sensor is activated indicating to the user that it has registered and is about to operate the device or it has operated the device. Alternatively, the LEDs can be on all the time to make the switch easy to find for vision impaired users with the light from the ring of the LEDs going out momentarily to let the user know that the switch has been activated. Because the switch senses the capacitance of the person triggering it by proximity (firstly) rather than touching or infrared sensing, it is not affected by graffiti over the lens and will still operate. Touching will still operate the switch though the switch is designed to only need the user to get near to cause the switch to work. It is flush mounted and secured from the back meaning that the appearance is pleasing and it is very vandal resistant as it is extremely difficult to access from the front. Other aspects can be added such as different colours and protective coatings.

FIG. 8 shows a 12 volt DC power supply 801 with bypass capacitor 802 and polarity protection diode 803. This voltage is supplied to 5 volt regulator 820, typically a 78L05, with bypass capacitors 819 and 820 at the source and output terminals. The derived voltage powers integrated circuit 822, a charge transfer touch sensor such as the Quantum Research QT113. A sensing electrode 828, formed as a large area on the printed circuit board 6, connects to the sensing electrodes of integrated circuit 822 both via capacitor 827 and directly. Additional high frequency bypassing may be provided by capacitor 826. The output of integrated circuit 822 is provided as a drive via resistor 823 to a field effect transistor (FET) 818. When the FET is biased on LEDs 808 to 813 are lighted by the current through parallel resistors 815 to 817 to the power supply negative. Capacitor 814 acts as a high frequency bypass. A feed is also supplied via blocking diode 824 to a switch 825 which may be operated to prevent the FET from being biased on and illuminating the LEDs. An additional output from integrated circuit 822, with high frequency bypass capacitor 831, drives FET 833 into conduction, pulling low a voltage supplied from the 5 volt supply across capacitor 826 through resistor 829 and blocking diode 830, and also operating a relay 837 supplied from the 12 volt supply 801. This opens a normally open pair of contacts 838 which may be utilized to operate the ancillaries. Resistor 804 and capacitor 839 act to buffer the relay coil.

A buzzer 806 with bypass resistor 805 and buffering capacitor 807 may also be biased on by the change of output of integrated circuit 822.

While the circuit shows one exemplification of a circuit capable of being operated by proximity of a user other variations or exemplifications are possible without departing from the inventive concept.

Preferably the circuit is sized to fit within the sensor housing and may use surface mount components for limiting size and adding reliability. In use it is preferred that the display LEDs and the sensing electrode are on one side of a printed circuit board with the remainder of the circuitry on the reverse.

Advantages a) Modest cost b) Easy to use c) Simple manufacture d) Vandal proof e) Weather resistant f) Operation cannot be affected by graffiti g) Meets disabled people's requirements h) Touch free i) Meets health requirements j) Is attractive in appearance k) Switch can provide either PNP or NPN switching l) Switch has a robust housing with a flush mounted flange/bezel and back nut which ensures a more vandal resistant construction by not being removable from the front.

m) Sensing element is insulated from the surrounding metal support surface so it can mounted on a metal plate without making the metal plate become active/live.

n) Switch incorporates ring of bright LED lights around the outside of the sensing element to give a very bright indication of the state of the switch.

o) The LED lights can be left off and turned on when activated or left on and turned off when activated.

p) Switch can offer either a normally closed circuit or normally open circuit.

q) Metal disc in switch acts as an amplifying aerial to provide a stronger signal.

r) Switch has a removable rear cap or cover to allow the PC board sensing element and LED lights to be removed for refurbishment or replacement.

s) Switch having switch JPC board and sensing element have been designed to fit into a very shallow housing so it can be installed in a very confined area.

t) Operation cannot be affected by graffiti.

VARIATIONS

Throughout the description of this specification, the word "comprise" and variations of that word such as "comprising" and "comprises", are not intended to exclude other additives, components, integers or steps.

To those skilled in the art to which the invention relates, many changes in construction and widely differing embodiments and application of the invention will suggest themselves without departing from the scope of the invention as defined in the appended claims. The disclosures and the descriptions herein are purely illustrative and are not intended to be limiting.

It will of course be realised that while the foregoing has been given by way of illustrative example of this invention, all such and other modifications and variations thereto as would be apparent to persons skilled in the art are deemed to fall within the broad scope and ambit of this invention as is hereinbefore described.

What I claim is:

1. A switch adapted to make and break a connection in an electric circuit to operate a device, the switch comprising:
   a front facing a user;
   a rear facing away from the user;
   a housing;
   a switch mechanism comprised of i) a lens facing the front, ii) a metal amplification disc, iii) a control element comprised of a PC board, iv) a lighting element, and v) a capacitive sensing element,
   the capacitive sensing element comprising an electrode and a capacitor triggered by proximity of the user,
   the disc increasing an activation field of the capacitor sensing element,
   wherein the capacitive sensing element is covered by the PC board, the PC board is covered by the disc, and the disc is covered by the lens;
   a power element connected for operating the lighting element and sensing element; and
   a communication element providing electrical connection to the device,
   wherein the switch is activated by the control element when a change in capacitance is sensed by the capacitive sensing element, and activiation of the switch provides that i) the information element and lighting element are viewed through the lens and ii) the device is made to operate,
   the capacitive sensing element being a touch-free proximity sensor allowing the switch to be activated by the user's proximity to the capacitive sensing element and without the user making physical contact with the switch.

2. A switch as claimed in claim 1, further comprising:
   an O-ring located around the lens, and sealingly engaging with the housing.

3. A switch as claimed in claim 1, further comprising:
   a cover threadingly engaging with a rear of the housing and covering the sensing element, the information element, and the control element.

* * * * *